United States Patent
Salzmann et al.

(10) Patent No.: US 6,262,906 B1
(45) Date of Patent: Jul. 17, 2001

(54) AIR-COOLED POWER CONVERTER, DRIVE DEVICE FOR ROLLING STANDS, AND POWER CONVERTER SYSTEM

(75) Inventors: Theodor Salzmann, Spardorf; Johann Wokusch, Forchheim; Tomas Greif, Röttenbach; Hans-Jürgen Müller, Erlangen, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/194,211

(22) PCT Filed: May 9, 1997

(86) PCT No.: PCT/DE97/00942

§ 371 Date: Aug. 25, 1999

§ 102(e) Date: Aug. 25, 1999

(87) PCT Pub. No.: WO97/44886

PCT Pub. Date: Nov. 27, 1997

(30) Foreign Application Priority Data

May 21, 1996 (DE) ................................ 196 20 085
Sep. 5, 1996 (DE) ................................ 196 36 094

(51) Int. Cl.$^7$ .................................................. H02M 5/45
(52) U.S. Cl. .......................................................... 363/141
(58) Field of Search ........................... 363/37, 141, 144; 367/150; 361/676, 687, 688, 709

(56) References Cited

U.S. PATENT DOCUMENTS

| | | |
|---|---|---|
| 3,746,967 * | 7/1973 | Koltuniak et al. ............... 363/70 |
| 3,766,977 * | 10/1973 | Pravda et al. ................... 165/47 |
| 4,015,173 | 3/1977 | Nitsche . |
| 4,864,385 | 9/1989 | Itahana et al. . |
| 4,864,483 * | 9/1989 | Divan ............................ 363/37 |
| 4,992,925 * | 2/1991 | Meyer ............................ 363/141 |
| 5,027,264 * | 6/1991 | DeDoncker et al. ............. 363/16 |
| 5,184,291 * | 2/1993 | Crowe et al. ................... 363/37 |
| 5,621,635 * | 4/1997 | Takiar ............................ 363/141 |
| 5,670,936 * | 9/1997 | Estes et al. ..................... 340/501 |

FOREIGN PATENT DOCUMENTS

| | | |
|---|---|---|
| 2 601 162 | 1/1988 | (FR) . |
| 62-086639 | 4/1987 | (JP) . |

OTHER PUBLICATIONS

Draper et al., "Thyristor–Supplied Tandem Cold Mill," Proceedings of IEEE, vol. 115, No. 10, Oct. 1968, pp. 1513–1522.

Krishnan, "Economic Factors Governing the Specification and Selection of Electrical Equipment for Large Reversing Drives in Rolling Mills," ASEA Journal, vol. 46, No. 4, 1973, pp. 85–88.

Listed in Search Report. Schulz et al., "Logidyn for Drives in Industrial Installations, with Particular Emphasis on the Thyristor Power Circuit," Technische Mitteilungen, vol. 62, No. 4/5, 1972, pp. 202–212.

Listed in Search Report. Herrmann, "Electrical Equipment for a Highly Automated Cold Mill," ABB Review, Zurich, CH, No. 5, 1991, p. 13–20.

Listed in Search Report. Lach et al., "Paralleling Hot Strip Mill M–G Sets with SCR's for Additional Power," Iron and Steel Engineer, Aug. 1971, pp. 89–94.

(List continued on next page.)

*Primary Examiner*—Adolf Deneke Berhane
(74) *Attorney, Agent, or Firm*—Kenyon & Kenyon

(57) ABSTRACT

An air-cooled power converter with gate turn-off power semiconductors, is described in which the cooling capacity is such that the temperature of the gate turn-off power semiconductor does not exceed a critical temperature limit, the power converter having optimized heat sinks, at least some of which are thermally connected in parallel, and the power converter is designed to operate at a continuous load of 1 to 20 megawatts, preferably of 2 to 10 megawatts.

19 Claims, 6 Drawing Sheets

OTHER PUBLICATIONS

Listed in Search Report. Moll, "Verivert K Subsynchronous Converter Cascades," Brown Boveri Review, vol. 74, No. 8, Aug. 1987, pp. 459–466.

Listed in Search Report. Philipps, "Thyristor Supply by Cold Rolling Mill Drives," BBC–Nachrichten, vol. 52, No. 10/11, Nov. 1970, pp. 315–321.

Listed in Search Report. "Driving Mills with Alternating Current," Steel Times Incorporating Iron & Steel, Surrey, GB, vol. 219, No. 6, Jun. 1991, p. 322.

Listed in Search Report. Fischer et al., "Design and Operational Behaviour of Air Cooled High Power 3–Level–Inverter with Reverse Conducting GTOs," PCIM '96, Official Proceedings of 18th European Power Conversion Conference, Nurnberg, DE, May 21, 1996, pp. 623–628.

* cited by examiner

US 6,262,906 B1

AIR-COOLED POWER CONVERTER, DRIVE DEVICE FOR ROLLING STANDS, AND POWER CONVERTER SYSTEM

FIELD OF THE INVENTION

The present invention concerns an air-cooled power converter with a gate turn-off.

BACKGROUND INFORMATION

Water-cooled megawatt power converters are known. However, conventional power converters are expensive to manufacture and maintain.

SUMMARY OF THE INVENTION

An object of the present invention is to provide a power converter in a capacity range of 1 to 10 MW that can be manufactured more advantageously compared to the conventional power converters. It is particularly desirable that a power converter in the capacity range of 1 to 20 MW be provided, which is easier and less expensive to operate and maintain than conventional power converters.

Air cooling for power converters operating in the range of 1 to 20 MW is considered unsuitable by experts in the field. It has, however, been shown that power converters in the above-mentioned capacity range with air cooling are feasible. Such air-cooled power converters have proven to be particularly cost-effective and require little maintenance compared to known water-cooled power converters.

In an advantageous embodiment of the present invention, heat sinks electrically connect gate turn-off power semiconductors. This electrical connection also represents a good heat connection, so that the heat generated in the power semiconductors is sufficiently dissipated. It has also proven to be advantageous to use heat sinks with such a high heat capacity that they react inertially to peak loads.

In another advantageous embodiment of the present invention, the power converter has a fan that supplies ambient air or pre-cooled air to the heat sinks or that advantageously draws ambient air through the heat sinks.

Other advantageous and inventive details are presented in the following description of the embodiment with reference to the drawing and in conjunction with the subclaims.

DETAILED DESCRIPTION OF THE INVENTION

Figure 1:
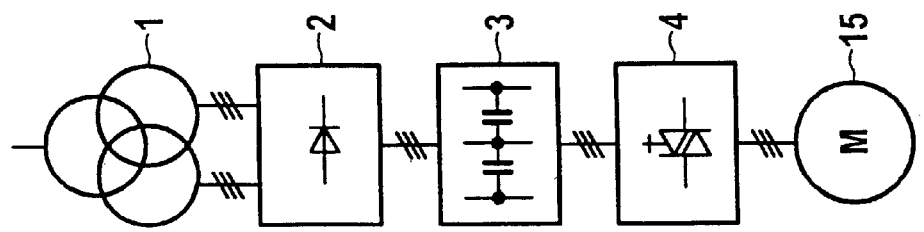
FIG. 1 shows a motor supplied by a power converter with a diode power rectifier on the line side.

FIG. 1 shows a motor 15 supplied by a power converter with a diode power rectifier 2 on the line side. The power converter arrangement is preferably designed as a series connection of two B6 diode bridges. The line-side connection is implemented using a transformer 1 with two secondary winding systems preferably electrically offset by 30° to achieve a 12-pulse phase effect. Diode power rectifier 2 is connected to the load-side power inverter 4 via voltage link 3 on the dc side. The voltage link is preferably connected across three poles—the positive link pole, the negative link pole, and the dc neutral. Load-side power inverter 4 is designed as self-commutated three-point power inverter to whose output three-phase motor 15 is connected using three conductors.

Figure 2:
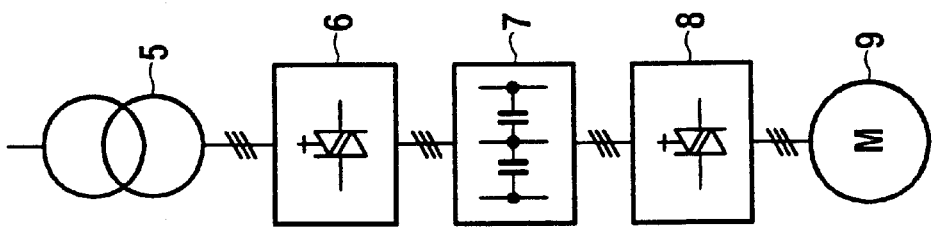
FIG. 2 shows a motor supplied by a power converter with a self-commutated power rectifier and power inverter also on the line side.

FIG. 2 shows a motor 9 supplied by a power converter with self-commutated power rectifier 6 and power inverter 8 on the line side. The power converter arrangement has a line-side self-commutated power rectifier 6, connected on the dc side to load-side power inverter 8 via voltage link 7. Both power converter sections 6 and 8 have a three-point design, and the voltage link is preferably connected via three poles—the positive link, the negative link, and the DC neutral. Load-side self-commutated power rectifier 6 is connected to the line via transformer 5. The circuit is preferably of the same design as that of load-side power inverter 8 and allows operation both as a power rectifier and as a power inverter for energy recovery, for example in braking motor 9. The output of load-side power inverter is connected to the three-phase motor via three conductors.

Figure 3:
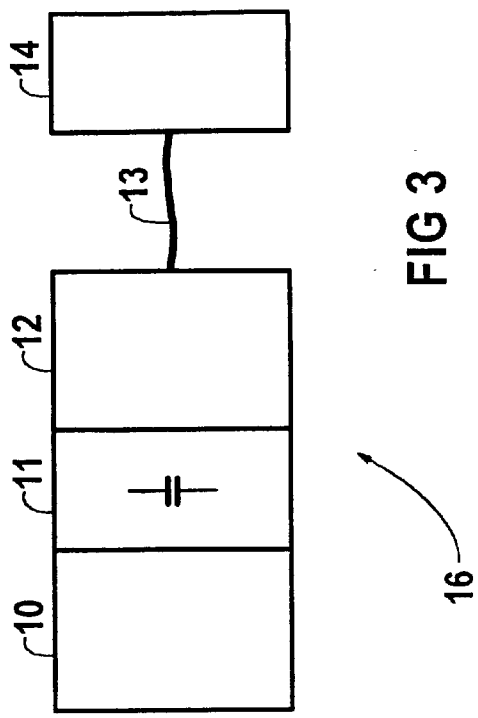
FIG. 3 shows a power converter arrangement with an automation device connected via optical fibers.

FIG. 3 shows a power converter arrangement with an automation device 14 for controlling power converter 16, the entire information exchange taking place over an optical fiber connection 13. Power converter 16 has a line-side power converter section 10, a voltage link 11, and a load-side power converter section 12. The power connections of the power converter sections with the line and the motor can be implemented as shown in FIGS. 1 and 2, for example. Power converter 10 contains all the sensors required for operation and monitoring, so that no other outside connections are needed. It is not shown that both the power converter and the automation device require an auxiliary power supply or a battery.

Figure 4:
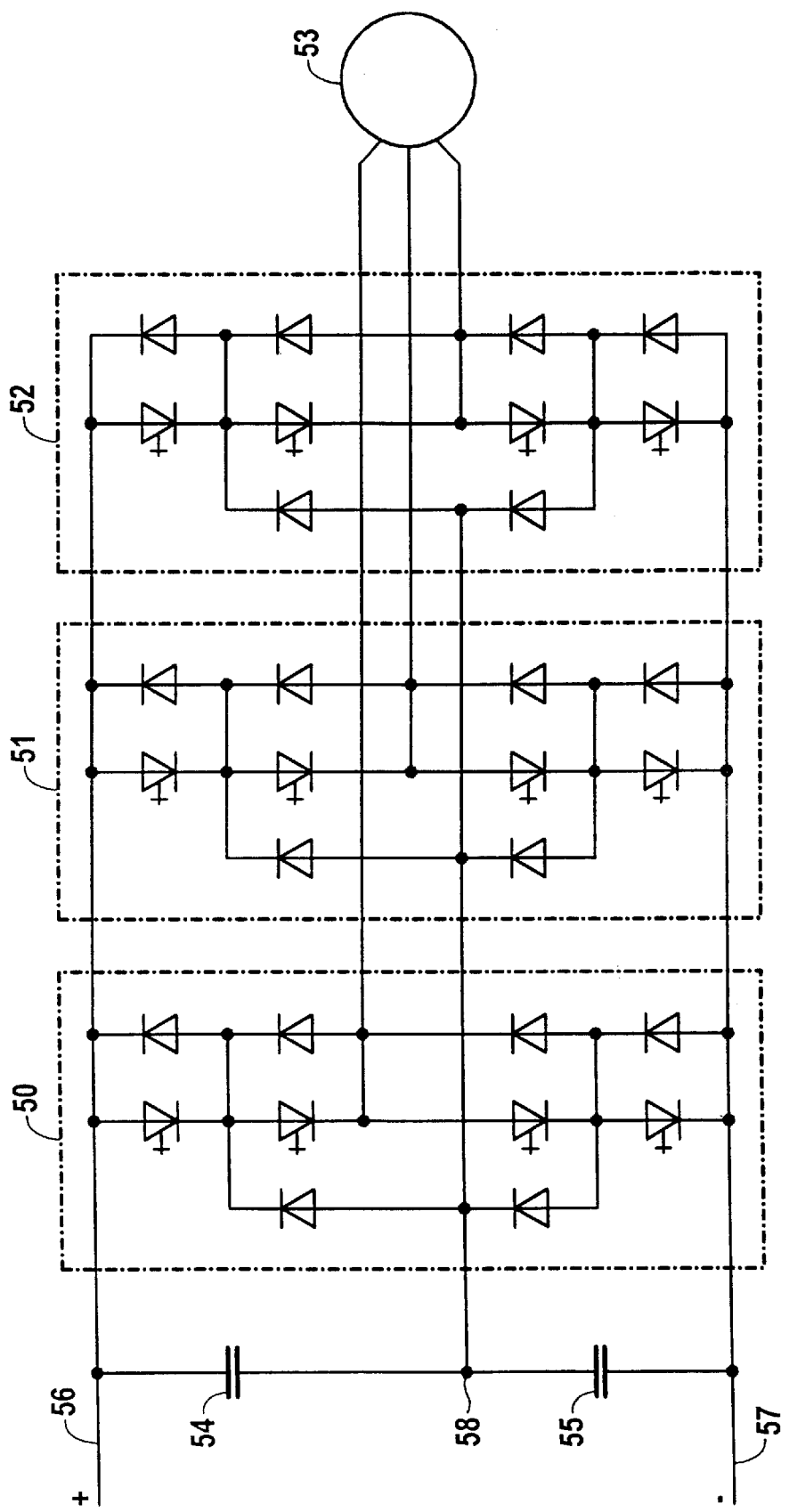
FIG. 4 shows a three-point power inverter with GTO thyristors (main circuit without RC circuit)

FIG. 4 shows the main circuit of a three-point power inverter. Positive-side link capacitor 54 and negative-side link capacitor 55 are connected in series between positive DC pole 56 and negative DC pole 57. Their point of connection forms DC neutral point 58. Phase modules 50, 51, 52, each with four GTOs connected in series and free-wheeling diodes connected in anti-parallel, are connected between the positive and negative DC poles. The point of connection between the first and second GTOs of a phase module and the third and fourth GTO of a phase module is connected to two additional diodes connected in series and in anti-parallel to the GTOS; the neutral point of these two diodes is connected to DC neutral point 58. The point of connection between the second and third GTO of a phase module forms the respective output terminal connected to motor 53.

Figure 5:
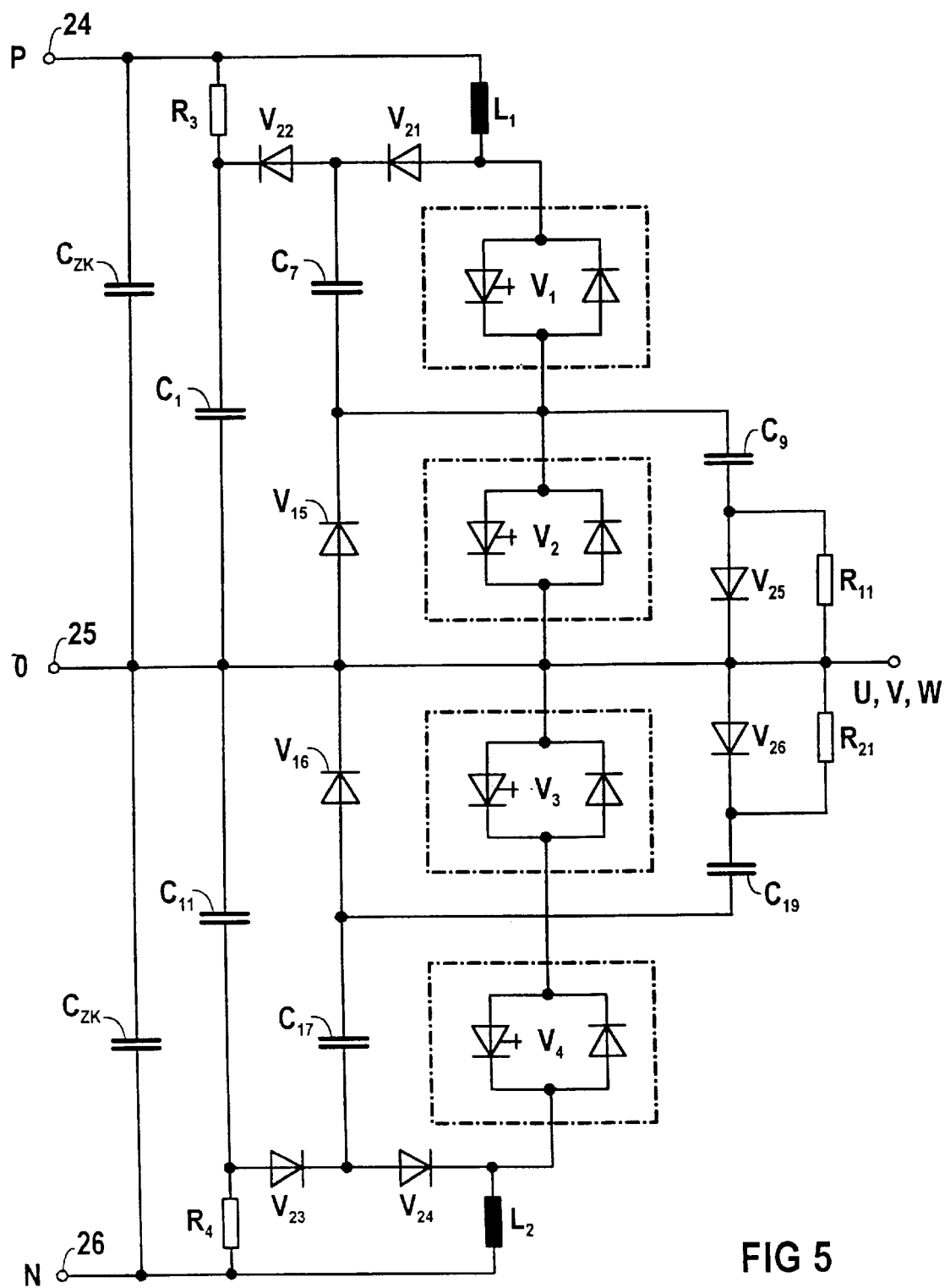
FIG. 5 shows a three-point power inverter with RC GTOs and RC circuit.

FIG. 5 shows a three-point power inverter component with RC GTOs and RC circuit. The series connection of an inductance L1, four RC GTOs (reverse conducting gate-turn-off thyristors) V1, V2, V3, V4 and inductance L2 between the positive DC pole 24 and the negative DC pole 26 form together with the two neutral point diodes V15 and V16 the main circuit of a phase module of a three-point power inverter. The anode of V15 is connected to DC neutral point 25 and its cathode is connected to the connection point of first RC GTO Vl with second RC GTO V2. The cathode of X16 is connected to DC neutral point 25 and its anode is connected to the connection point of third RC GTO V3 with fourth RC GTO V4. The connection point between the second RC GTO V2 and the third RC GTO V3 forms the ac output of phase module V (V or W).

L1 and L2 are used to limit the current rise rate; RC circuits V21 and V22 with C7 and C1, as well as V24 and V23 with C17 and C11 are used to limit the voltage rise rate when switching the GTOs. The energy stored in the respective RC circuits in each switching operation is converted into heat at resistors R3 and R4 and the overcharging of capacitors C1 and C11 is prevented or reversed.

The two RCD protection circuits R11, C9, V25 and R21, C19, V26 are used as additional protection of the two middle RC GTOs V2 and V3. They are advantageously used in high-capacity power converters with the resulting large physical dimensions for preventing voltage surges in design-related parasitic inductances of GTOs V2 and V3.

Figure 6:
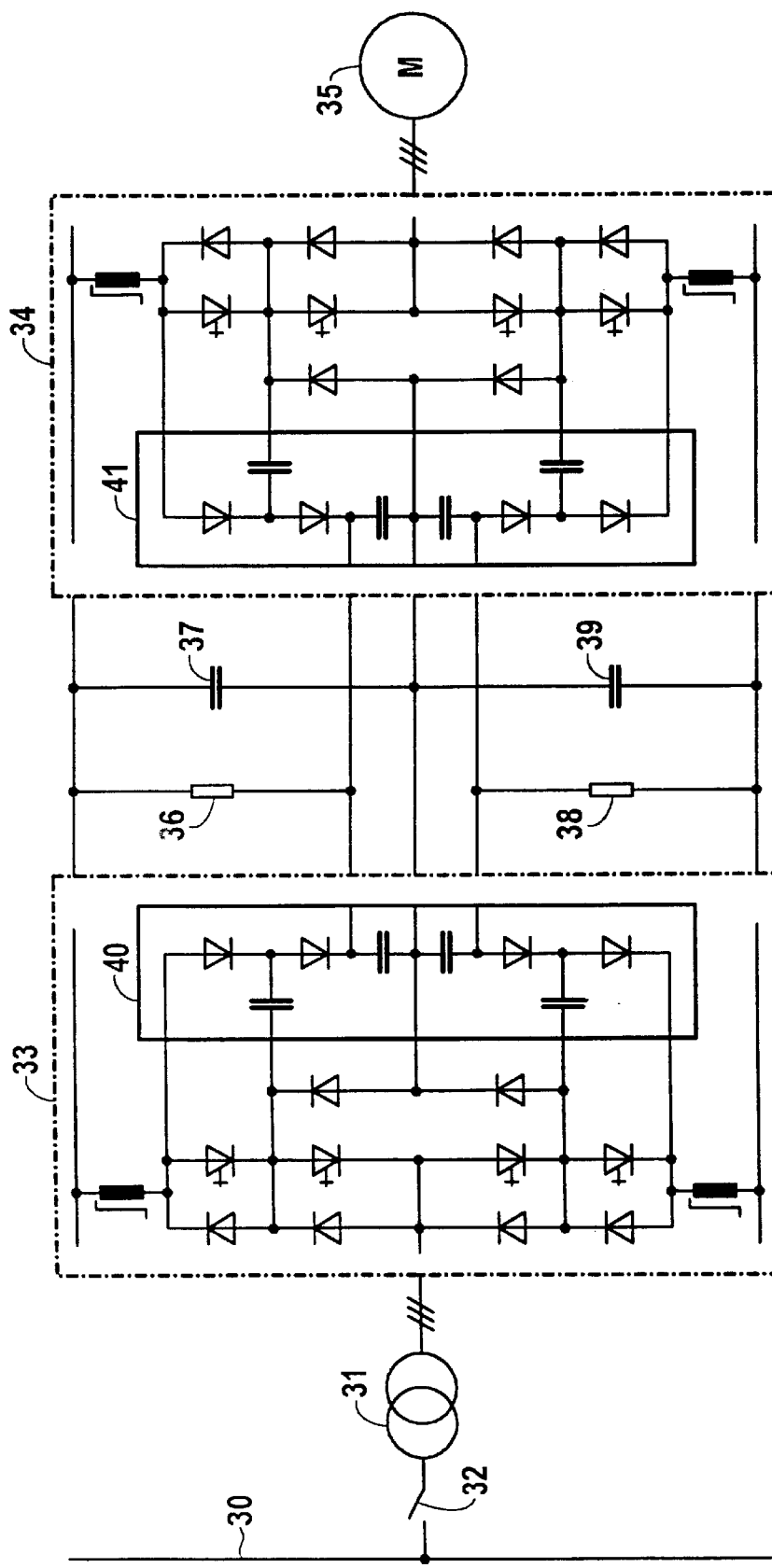
FIG. 6 shows a power converter arrangement for supplying a three-phase motor with a three-point power converter section on the line and load side.

FIG. 6 shows a power converter arrangement for supplying a three-phase motor with the line-side power converter section 33 and load-side power converter section 34 having the same three-point design with GTOs. The main circuit of each phase module is illustrated with their respective RC circuits 40 and 41. Positive-side link capacitor 37 forms, together with negative-side link capacitor 39, the DC voltage link, over which the two power converter sections are connected. The positive-side RC charge reversal resistor 36 and the negative-side RC charge reversal resistor 38 are connected to the respective sides of RC circuits 40 and 41. The output of line-side power converter section 33 is connected to line 30 via transformer 31 and circuit breaker 32. The output of load-side power converter section 34 is connected to three-phase motor 35.

Figure 7:
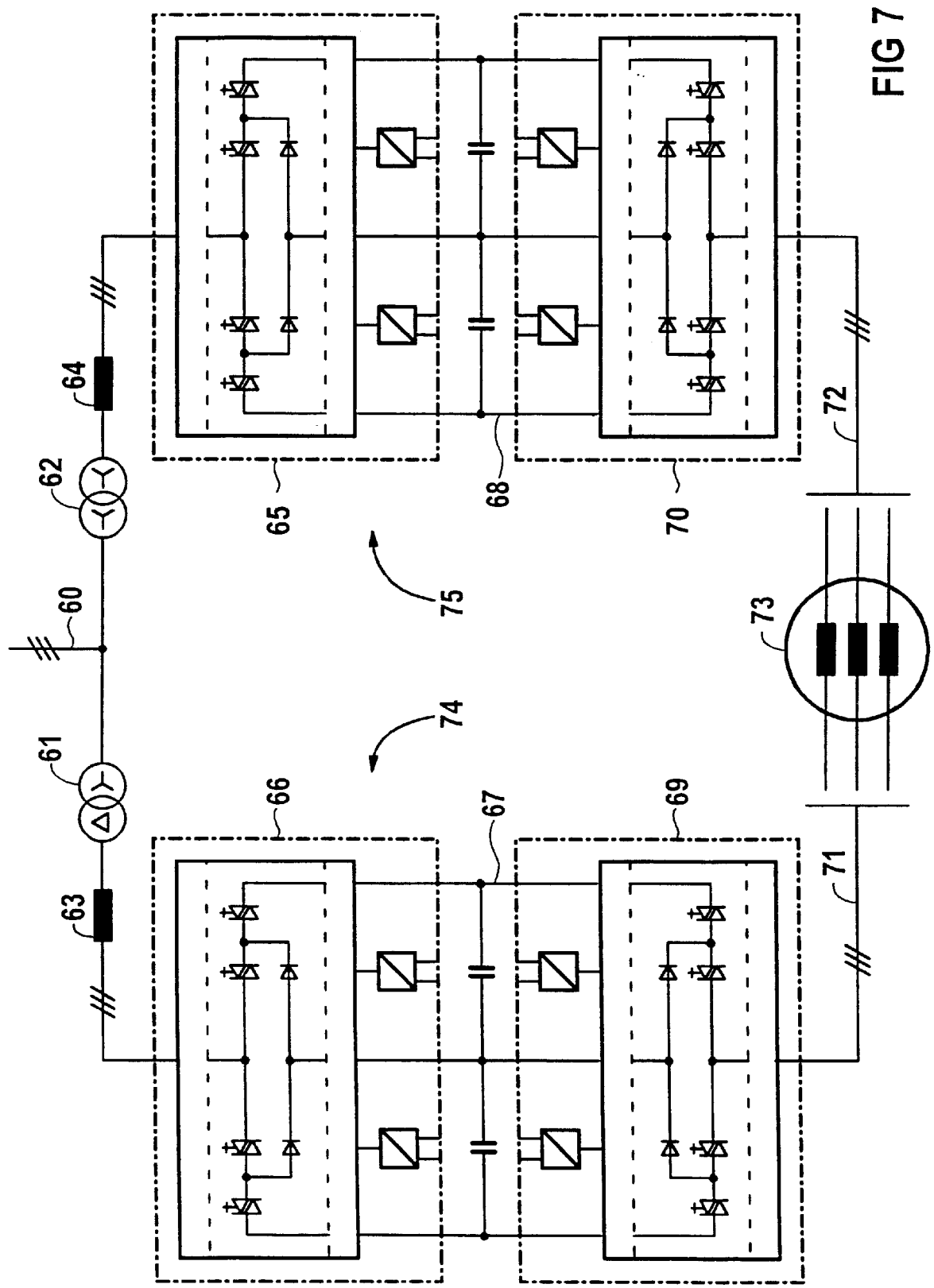
FIG. 7 shows a power converter arrangement for double-sided supply of a three-phase motor having an open winding with a three-point power converter section.

In the arrangement of FIG. 7, the output of a first power converter 74 and the output of a second power converter 75 are connected to a side 71 and 72, respectively, of the open three-phase winding of three-phase motor 73. With this arrangement, a particularly advantageous operating condition is achieved in addition to doubling the capacity, since, as assumed according to the tuned pulse method, a largely sinusoidal current is achieved in the motor with low harmonics even at low switching frequencies.

On the line side, first power converter 74 is connected to power supply line 60 via an optional line-side additional inductance 63 and a first star/delta connected transformer 61, for example. The second power converter 75 is connected to power supply line 60 via an optional line-side additional inductance 64 and a second transformer 62, preferably electrically offset with respect to the first transformer by 30° (e.g., star/star connected). With this arrangement, particularly advantageous line reaction conditions are obtained, especially when, as in the present example, the power converter is composed of three-point connected power converter sections. Even at a fundamental component load of the self-commutated line power converter, a sinusoidal current is obtained with very little harmonics.

The two power converters 74 and 75 have line-side power converter sections 66 and 65 and load-side power converter sections 69 and 70, respectively, each of which is connected via DC voltage link 67 and 68, respectively. The two DC voltage links 67 and 68 are electrically insulated from one another. All power converter sections 66, 65, 69, 70 are three-point connected, preferably with RC GTOs.

Figure 8:
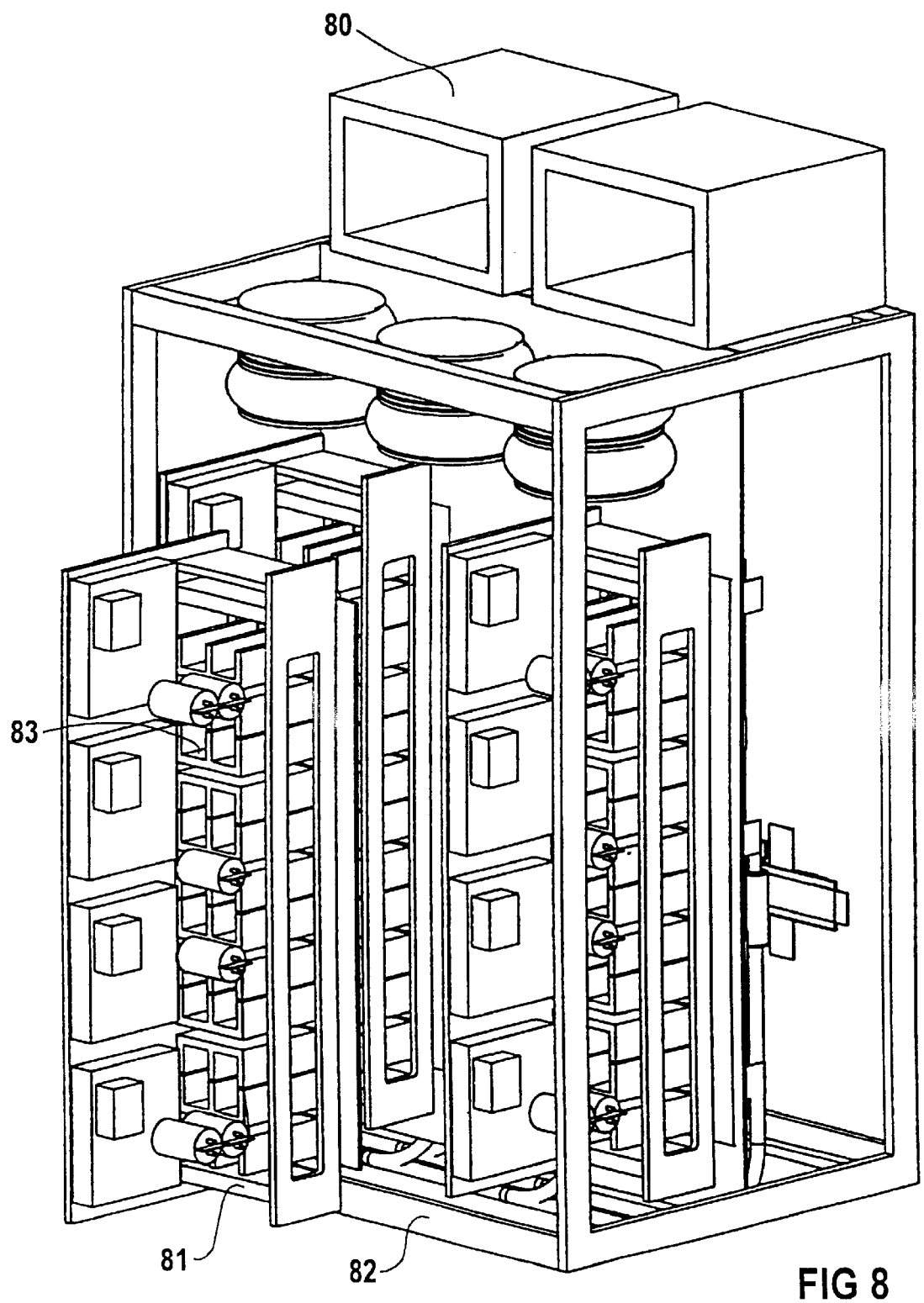
FIG. 8 shows the mechanical construction of a power converter according to the present invention.

FIG. 8 shows the mechanical construction of an air-cooled power converter according to the present invention. The semiconductor elements are mounted in this embodiment on a pull-out power rectifier module 81. Power rectifier module 81 can be inserted into a support 82. Support 82 is shown in FIG. 8 without side walls or doors. The unit is cooled using an air current generated by fan 80 and blown through support 82 and inserted power rectifier module 81. The semiconductors of power rectifier 81 are preferably arranged between heat sinks 83, which are also cooled by the air stream.

What is claimed is:

1. An air-cooled power converter, comprising:
   gate turn-off power semiconductors; and
   heat sinks cooling the gate turn-off power semiconductors and having an optimized design, at least some of the heat sinks being thermally connected in parallel,
   wherein a cooling capacity of the power converter prevents a temperature of the gate turn-off power semiconductors from exceeding a predetermined critical temperature, and wherein the power converter operates at a continuous load of between 1 megawatt and 20 megawatts.

2. The power converter according to claim 1, wherein the continuous load is between 2 megawatts and 20 megawatts.

3. The power converter according to claim 1, wherein the heat sinks electrically connect individual ones of the gate turn-off power semiconductors.

4. The power converter according to claim 1, wherein the power converter responds inertially to load peaks due to a heat capacity of the heat sinks.

5. The power converter according to claim 1, further comprising:
   a fan one of supplying ambient air to the heat sinks, supplying a pre-cooled air to the heat sinks, and drawing ambient air through the heat sinks.

6. The power converter according to claim 1, further comprising:
   a DC voltage link.

7. The power converter according to claim 6, further comprising:
   a three-point connected DC voltage link.

8. The power converter according to claim 7, further comprising:
   an n-point connected power converter,
   wherein n is equal to or greater than 5.

9. The power converter according to claim 1, further comprising:
   a current link.

10. The power converter according to claim 1, wherein the power converter is a direct power converter.

11. The power converter according to claim 1, wherein the gate turn-off power semiconductors include gate turn-off thyristors.

12. The power converter according to claim 1, wherein the gate turn-off semiconductors include MOS-controlled thyristors.

13. A drive device for rolling stands, comprising:
   gate turn-off power semiconductors including insulated gate bipolar transistors;
   heat sinks having an optimized design, at least some of the heat sinks cooling the gate turn-off power semiconductors and being thermally connected in parallel;
   wherein a cooling capacity of the drive device prevents a temperature of the gate turn-off power semiconductors from exceeding a predetermined critical temperature, and wherein the power converter operates at a continuous load of between 1 megawatt and 20 megawatts.

14. The drive device according to claims 13, wherein the gate turn-off power semiconductors are reverse-conducting.

15. The power converter according to claim 1, wherein the power converter operates at a shock load of between 2 megawatts and 30 megawatts.

16. The power converter according to claim 15, wherein the shock load is between 4 megawatts and 20 megawatts.

17. A power converter system, comprising:

two power converters, each of the two power converters including gate turn-off power semiconductors and heat sinks cooling the gate turn-off power semiconductors, at least some of the heat sinks being thermally connected in parallel, wherein a cooling capacity of each of the two power converters prevents a temperature of the gate turn-off power semiconductors from exceeding a predetermined critical temperature, and wherein each of the two power converters operates at a continuous load of between 1 megawatt and 20 megawatts; and an electric motor connected to the two power converters in tandem, the electric motor including open windings and being supplied with power by the two power converters, a first one of the two power converters supplying the power from a first side of the electric motor, a second one of the two power converters supplying the power from a second side of the electric motor.

18. The power converter according to claim 1, wherein the power converter is designed as a fuseless power converter.

19. The power converter according to claim 1, wherein the power converter supplies an electric motor, the electrical motor being used in one of a rolling mill of a shipyard, an electric vehicle and a line compensation.

* * * * *